United States Patent
Bayram et al.

(10) Patent No.: US 9,608,160 B1
(45) Date of Patent: Mar. 28, 2017

(54) POLARIZATION FREE GALLIUM NITRIDE-BASED PHOTONIC DEVICES ON NANOPATTERNED SILICON

(71) Applicant: International Business Machines Corporation, Armonk, NY (US)

(72) Inventors: Can Bayram, Champaign, IL (US); Cheng-Wei Cheng, White Plains, NY (US); Tayfun Gokmen, Briarcliff Manor, NY (US); Ning Li, White Plains, NY (US); John A. Ott, Greenwood Lake, NY (US); Devendra K. Sadana, Pleasantville, NY (US); Kuen-Ting Shiu, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/016,799

(22) Filed: Feb. 5, 2016

(51) Int. Cl.
| | |
|---|---|
| H01L 29/15 | (2006.01) |
| H01L 33/00 | (2010.01) |
| H01L 33/12 | (2010.01) |
| H01L 33/32 | (2010.01) |
| H01L 33/22 | (2010.01) |

(Continued)

(52) U.S. Cl.
CPC ............ *H01L 33/007* (2013.01); *H01L 33/12* (2013.01); *H01L 33/18* (2013.01); *H01L 33/22* (2013.01); *H01L 33/32* (2013.01); *H01L 33/36* (2013.01); *H01L 2933/0016* (2013.01)

(58) Field of Classification Search
CPC ......... H01L 33/12; H01L 33/18; H01L 33/22; H01L 33/32; H01L 33/36; H01L 2933/0016
USPC .......................................................... 257/76
See application file for complete search history.

(56) References Cited

U.S. PATENT DOCUMENTS

| | | | |
|---|---|---|---|
| 7,091,514 B2 | 8/2006 | Craven et al. | |
| 7,279,717 B2 * | 10/2007 | Yamada | B82Y 20/00 257/13 |
| 7,338,828 B2 | 3/2008 | Imer et al. | |

(Continued)

FOREIGN PATENT DOCUMENTS

| | | |
|---|---|---|
| CN | 101009346 A | 8/2007 |
| CN | 101009347 A | 8/2007 |

(Continued)

*Primary Examiner* — Tod T Van Roy
*Assistant Examiner* — Vu A Vu
(74) *Attorney, Agent, or Firm* — Scully, Scott, Murphy & Presser, P.C.; Louis J. Percello, Esq.

(57) ABSTRACT

After forming patterned dielectric material structures over a (100) silicon substrate, portions of the silicon substrate that are not covered by the patterned dielectric material structures are removed to provide a plurality of openings within the silicon substrate. Each opening exposes a surface of the silicon substrate having a (111) crystalline plane. A buffer layer is then formed on the exposed surfaces of the patterned dielectric material structures and the silicon substrate. A dual phase Group III nitride structure including a cubic phase region is formed filling a space between each neighboring pair of the patterned dielectric material structures and one of the openings located beneath the space. Finally, at least one Group III nitride layer is epitaxially deposited over the cubic phase region of the dual phase Group III nitride structure.

17 Claims, 5 Drawing Sheets

(51) Int. Cl.
*H01L 33/18* (2010.01)
*H01L 33/36* (2010.01)

(56) References Cited

U.S. PATENT DOCUMENTS

| | | | |
|---|---|---|---|
| 8,217,418 B1 | 7/2012 | Pan et al. | |
| 8,313,967 B1* | 11/2012 | Lee | H01L 21/02381 |
| | | | 257/200 |
| 8,624,292 B2 | 1/2014 | Pan et al. | |
| 9,048,173 B2* | 6/2015 | Bayram | H01L 29/04 |
| 2014/0131722 A1* | 5/2014 | Bayram | H01L 29/04 |
| | | | 257/76 |
| 2015/0108427 A1* | 4/2015 | Brueck | H01L 21/02381 |
| | | | 257/14 |

FOREIGN PATENT DOCUMENTS

| | | |
|---|---|---|
| CN | 102593298 B | 4/2015 |
| KR | 10-2009-0051355 A | 5/2009 |

\* cited by examiner

POLARIZATION FREE GALLIUM NITRIDE-BASED PHOTONIC DEVICES ON NANOPATTERNED SILICON

BACKGROUND

The present application relates to photonic devices formed with Group III nitrides, and more particularly to photonic devices formed with polarization free Group III nitrides on (100) silicon substrates.

Group III nitrides are a unique group of semiconductor materials which can be used for fabrication of visible and ultraviolet high-power and high-performance photonic devices, specifically laser diodes. Group III nitrides are composed of nitrogen and at least one element from Group III, i.e., aluminum (Al), gallium (Ga) and indium (In), of the Periodic Table of Elements. Illustrative examples of some common Group III nitrides are GaN, GaAlN, and GaAlInN. By changing the composition of Al, Ga and/or In within Group III nitrides, the emission of Group III nitrides can be tuned along the electromagnetic spectrum; mainly from 210 nm to 1770 nm.

Group III nitride-based laser diodes are highly demanded for many portable consumer devices such as handheld projectors, high resolution televisions, displays, and lighting. The challenges for making high efficiency Group III nitride-based laser diodes are numerous. First of all, Group III nitrides are typically grown epitaxially over a substrate by conventional growth techniques including molecular beam epitaxy (MBE), metalorganic chemical vapor deposition (MOCVD) or hybrid vapor phase epitaxy (HVPE). The Group III nitrides can crystalize in a hexagonal wurtzite phase or in a cubic phase. The epitaxial growth of Group III nitrides on a conventional substrate such as, sapphire or SiC, typically results in formation of wurtzite phase Group III nitrides due to higher stability of wurtzite phase. However, the wurtzite phase is not a preferred phase for laser diodes because the wurtzite phase leads to a spontaneous polarization that induces an internal electric field. Such internal electric field is often deleterious for laser diodes as the internal electric field reduces the recombination efficiency of electrons and holes and also makes it difficult to push towards the optical emission of laser diodes to longer wavelengths. Forming Group III nitrides having a cubic phase can eliminate piezoelectric fields and enhance radiative recombination dynamics as the cubic phase is non-polar and has thus no net polarization filed (i.e., polarization free). Another problem for growing high quality Group III nitride films is the lack of a suitable substrate that matches the lattice constant of the Group III nitride films. Group III nitride films heteroepitaxially grown on highly lattice-mismatched substrates such as sapphire, SiC and silicon contain high densities of defects (around $1.0 \times 10^9$ defects/$cm^2$). Dry etching or polishing is thus needed to form cavity mirrors for laser radiation. However, such processes normally cause non-ideal cavity mirror formation.

Therefore, there remains a need for a method that allows growing high quality cubic phase Group III nitrides for photonic applications.

SUMMARY

The present application provides a method that allows growing non-polar Group III nitride thin films on a patterned (100) silicon substrate for fabrication high efficiency photonic devices. The method of the present application also allows an easy integration of Group III nitride-based photonic devices with silicon technology. After forming patterned dielectric material structures over a (100) silicon substrate, portions of the silicon substrate that are not covered by the patterned dielectric material structures are removed to provide a plurality of openings within the silicon substrate. Each opening exposes a surface of the silicon substrate having a (111) crystalline plane. A buffer layer is then formed on the exposed surfaces of the patterned dielectric material structures and the silicon substrate. A dual phase Group III nitride structure including a cubic phase region is formed filling a space between each neighboring pair of the patterned dielectric material structures and one of the openings located beneath the space. Finally, at least one Group III nitride layer is epitaxially deposited over the cubic phase region of the dual phase Group III nitride structure.

In one aspect of the present application, a method of forming a semiconductor structure is provided. The method includes first forming a dielectric material layer on an uppermost surface of a (100) silicon substrate. The dielectric material layer is then patterned forming a plurality of patterned dielectric material structures on portions of the uppermost surface of the (100) silicon substrate and exposing other portions of the uppermost surface of the (100) silicon substrate. Next, the exposed another portions of the uppermost surface of the (100) silicon substrate are etched to form a plurality of openings within the (100) silicon substrate. Each of the plurality of openings exposes a surface having a (111) crystal plane within the (100) silicon substrate. After forming a buffer layer on exposed surfaces of the plurality of patterned dielectric material structures and the (100) silicon substrate, a dual phase Group III nitride structure is formed filling a space between each neighboring pair of the plurality of patterned dielectric material structures and one of the plurality of openings located beneath the space. The dual phase Group III nitride structure includes a wurtzite phase region and a cubic phase region which defines an uppermost surface of the Group III nitride structure. Next, at least one Group-III nitride layer is epitaxially grown on the cubic phase region of the dual phase Group-III nitride structure.

In another aspect of the present application, a semiconductor structure is provided. The semiconductor structure includes a (100) silicon substrate having a plurality of openings located within the (100) silicon substrate. Each of the plurality of openings exposes a surface of the (100) silicon substrate having a (111) crystal plane. The semiconductor structure further includes a plurality of patterned dielectric material structures located on an uppermost surface of the (100) silicon substrate and a dual phase Group III nitride structure filling a space between each neighboring pair of the plurality of patterned dielectric material structures and one of the plurality of openings located beneath the space. The dual phase Group III nitride structure includes a wurtzite phase region and a cubic phase region which defines at least a portion of an uppermost surface of the dual phase Group III nitride structure. Yet further, the semiconductor structure includes at least one Group III nitride layer located over the dual phase Group III nitride structure.

DETAILED DESCRIPTION

Figure 1:
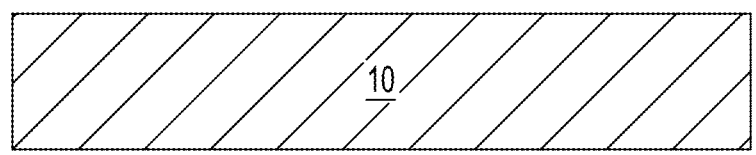
FIG. 1 is a cross sectional view of a (100) silicon substrate that can be employed in one embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated a silicon substrate 10 which has a (100) crystallographic surface orientation that can be employed in one embodiment of the present application. The silicon substrate 10 having the (100) crystallographic surface orientation may also be referred to herein as "a (100) silicon substrate". In one embodiment, and as illustrated in the drawings, the (100) silicon substrate 10 may be a bulk semiconductor material having silicon located between a planar uppermost surface and a planar bottommost surface. In another embodiment, the (100) silicon substrate 10 may be a topmost layer of a silicon-on-insulator substrate. In such an embodiment, an insulator material layer such as, for example, a dielectric oxide layer, can be located between the planar uppermost surface and a planar bottommost surface of the silicon-on-insulator substrate, and the (100) silicon substrate 10 is located on an uppermost surface of the insulator material layer. A semiconductor material layer such as, for example, silicon, germanium, silicon germanium, a III-V compound semiconductor material or a II-VI semiconductor material layer can be located beneath the insulator material layer of the silicon-on-insulator substrate. In yet another embodiment, the (100) silicon substrate 10 can be a topmost layer of a multilayered stack of semiconductor material layers. In still yet another embodiment, the (100) silicon substrate can be a topmost layer of a silicon-on-sapphire substrate.

The (100) silicon substrate 10 that can be employed in the present application is typically a single crystalline material layer and may be doped, undoped or contain regions that are doped and other regions that are non-doped. The dopant may be an n-type dopant selected from an Element from Group VA of the Periodic Table of Elements (i.e., P, As and/or Sb) or a p-type dopant selected from an Element from Group IIIA of the Periodic Table of Elements (i.e., B, Al, Ga and/or In). The (100) silicon substrate 10 may contain one region that is doped with a p-type dopant and other region that is doped with an n-type dopant. The thickness of the (100) silicon substrate 10 can be from 50 μm to 2 cm, although lesser and greater thickness can also be employed.

Figure 2:
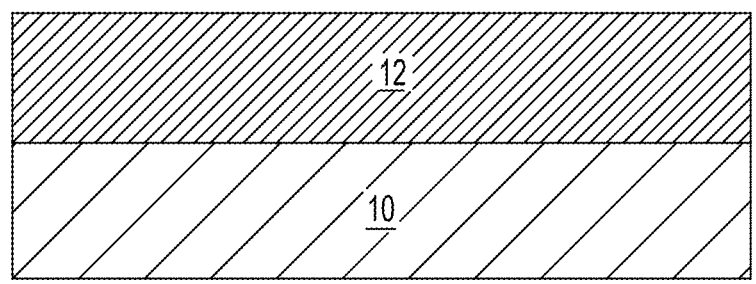
FIG. 2 is a cross sectional view of the silicon substrate of FIG. 1 after forming a dielectric material layer on an uppermost surface of the silicon substrate.

Referring now to FIG. 2, there is illustrated the (100) silicon substrate 10 of FIG. 1 after forming a dielectric material layer 12 on an uppermost surface of the (100) silicon substrate 10. As shown, the dielectric material layer 12 is a contiguous layer that covers the entire uppermost surface of the (100) silicon substrate 10. In some embodiments, the dielectric material layer 12 can be comprised of silicon dioxide, silicon nitride or silicon oxynitride.

In one embodiment of the present application, the dielectric material layer 12 can be formed using a thermal process including, for example, thermal oxidation, thermal nitridation and thermal oxynitridation. In such an embodiment, the (100) silicon substrate 10 is heated in an oxidizing and/or nitriding ambient at a temperature of 700° C. or greater. In another embodiment of the present application, the dielectric material layer 12 can be formed onto the uppermost surface of the (100) silicon substrate 10 by utilizing a deposition process such as, for example, chemical vapor deposition (CVD), and plasma enhanced chemical vapor deposition (PECVD). Notwithstanding which technique is used in forming the dielectric material layer 12, the dielectric material layer 12 typically has a thickness a few monolayers to as thick as a couple of microns or more.

Figure 3:
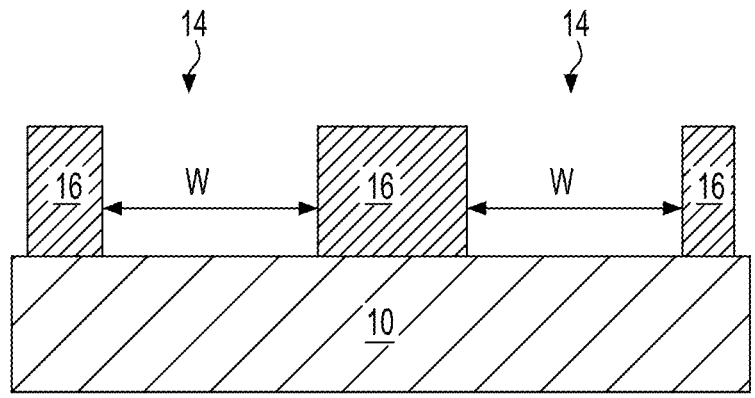
FIG. 3 is a cross sectional view of the structure of FIG. 2 after forming first openings extending through the dielectric material layer to provide patterned dielectric material structures.

Referring to FIG. 3, there is illustrated the structure of FIG. 2 after forming a plurality of first openings 14 through the dielectric material layer 12 to expose the uppermost surface of the (100) silicon substrate. The remaining portions of the dielectric material layer are herein referred to as patterned dielectric material structures 16. The patterned dielectric material structures 16 are employed in the present application as an etch mask and are used in forming periodic openings within the (100) silicon substrate 10. As shown, the patterned dielectric material structures 16 are located on portions of the uppermost surface of the (100) silicon substrate 10, while other portions of the (100) silicon substrate 10 are exposed.

The first openings 14 can be formed by lithography and etching. The lithographic step includes applying a photoresist layer (not shown) on the uppermost surface of the dielectric material layer 12, exposing the photoresist layer to radiation and developing the exposed photoresist layer. This provides a patterned photoresist layer atop portions of the dielectric material layer 12. The pattern in the patterned photoresist layer is thereafter transferred into the dielectric material layer 12 utilizing an etch process that removes the dielectric material of the dielectric material layer 12 selective to the semiconductor material of the (100) silicon substrate 10. In one embodiment, the etch process that selectively removes exposed portions of the dielectric material layer 12 is an anisotropic etch which can be a dry etch such as, for example, reactive ion etch (RIE) or a wet etch involving a chemical etchant. After the etching process has been performed, the patterned photoresist layer is stripped from the structure utilizing a conventional resist stripping process such as, for example, ashing.

The first openings 14 that are formed have substantially vertical sidewalls. The width (w) of the first openings 14 is set to allow formation of a cubic phase Group III nitride region. In one embodiment, the width (w) of the first openings 14 can be from 200 nm to 500 nm, although lesser and greater widths can also be employed.

Each of the patterned dielectric material structures 16 defined by the first openings 14 thus has four sides, i.e., four vertical sidewalls, and thus is in the shape of a parallelogram. In one embodiment, each patterned dielectric material structure 16 is a square. In another embodiment, each patterned dielectric material structure 16 is a rectangle.

Each patterned dielectric material structure 16 has a length and width. In some embodiments, the length can equal the width. In other embodiments, the length can be different (greater than or less than) from the width. The length of each patterned dielectric material structure 16 can be within a range from 10 nm to 100 μm, while the width can be from 10 nm to 100 μm. Other width and length values are possible with the upper limit being application dependent. In the present application, the width of each patterned dielectric material structure 16 runs parallel to the cross section shown in FIG. 3, while the length of each patterned dielectric material structure 16 runs into and out of the cross section shown in FIG. 3.

Figure 4:
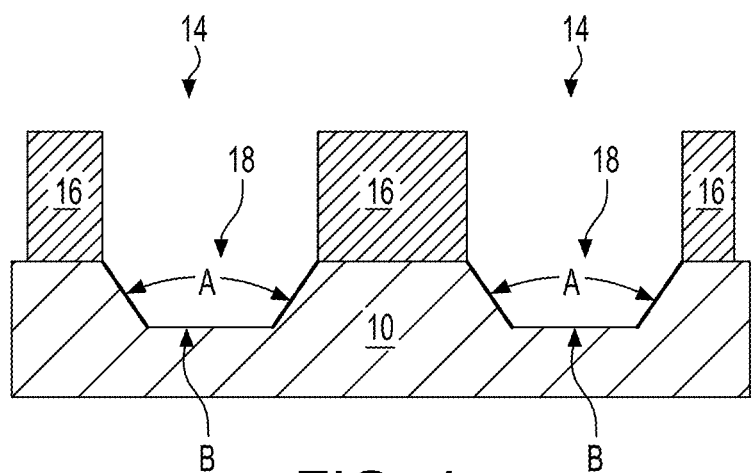
FIG. 4 is a cross sectional view of the structure of FIG. 3 after forming second openings within the silicon substrate each of which exposes a surface of the silicon substrate having a (111) crystal plane.

Referring now to FIG. 4, there is illustrated the structure of FIG. 3 after etching portions of the (100) silicon substrate 10 that are exposed by the first openings 14 using patterned dielectric material structures 16 as an etch mask, thereby forming second openings 18 in the (100) silicon substrate 10. Each second opening 18 exposes a slanted surface (designated as "A" in FIG. 4) of the (100) silicon substrate 10 that has a (111) crystal plane and a planar surface (designated as "B" in FIG. 4) located beneath the uppermost surface of the (100) silicon substrate 10 that has a (100) crystal plane. By "(111) crystal plane" it is meant any plane within the (111) crystal plane family including, but not limited to, 111, 1bar11, and 11bar1. By "(100) crystal plane" it is meant any plane within the (100) crystal plane family.

The etching of the exposed portions of the (100) silicon substrate 10 can be performed utilizing a crystallographic wet etch; the crystallographic wet etch may also be referred to as an anisotropic wet etch that is orientation dependent. In one embodiment of the present application, the crystallographic wet etch that is employed includes using KOH as a chemical etchant. Other chemical etchants can be used in the crystallographic wet etch as long as the chemical etchant that is selected is capable of exposing a surface of the (100) silicon substrate 10 having the (111) crystal plane within each second opening 18. Examples of other chemical etchants that can be used in the crystallographic wet etch of the present application, include, but are not limited to, an aqueous solution of ethylene diamine and pyrocatechol or tetramethylammonium hydroxide.

In accordance with an aspect of the present application, each second opening 18 that is formed within the (100) silicon substrate 10 has an upper portion having a first width that is larger than a second width of a lower portion. Each second opening 18 can thus be V-shaped (not shown) or trapezoid-shaped as shown in FIG. 4. In some embodiments of the present application, the first width of the upper portion of each second opening 18 is substantially the same as the width (w) of each first opening 14. In other embodiments, an upper portion of each second opening 18 can extend beneath each of the patterned dielectric material structures 16, thus the first width of the upper portion of each second opening 18 is greater than the width (w) of each first opening 14. The depth of each second opening 18 that is formed, as measured from the uppermost surface of the (100) silicon substrate 10 to the planar surface B is from a couple nanometers to 0.7×first width of the second openings 18.

In some embodiments of the present application, the structure that is shown in FIG. 4 may be heated in a hydrogen atmosphere and then a prealuminization process is performed which stabilizes the surfaces of the (100) silicon substrate 10. These steps are performed prior to forming a buffer layer, and prior to forming dual phase Group III nitride structures. The heating of the structure shown in FIG. 4 in a hydrogen atmosphere includes placing the structure shown in FIG. 4 into a reactor chamber of a MOCVD apparatus. In some embodiments, and prior to placing the structure shown in FIG. 4 into the MOCVD reactor chamber, the structure can be cleaned using an HF cleaning process. The MOCVD reactor chamber including the structure shown in FIG. 4 is then evacuated to a pressure of about 50-100 mbar or less and then a hydrogen atmosphere is introduced into the reactor chamber. In some embodiments, the pressure within the MOCVD reactor is at atmospheric, i.e., 760 mbar. The hydrogen atmosphere may include pure hydrogen or hydrogen admixed with an inert carrier gas such as, for example, helium and/or argon. When an admixture is employed, hydrogen comprises at least 25% or greater of the admixture, the remainder of the admixture (up to 100%) is comprised of the inert carrier gas. With the hydrogen atmosphere present in the reactor chamber, the structure is heated to a temperature of about 900° C. or less. In one embodiment, the temperature in which the structure shown in FIG. 4 is heated under the hydrogen atmosphere is from 500° C. to 600° C. In another embodiment, the temperature in which the structure shown in FIG. 4 is heated under the hydrogen atmosphere is from 600° C. to 900° C. Notwithstanding the temperature in which the structure of FIG. 4 is heated under the hydrogen atmosphere, the heating is performed for a time period of 5 minutes to 20 minutes. This step of the present application is believed to clean the surfaces and hydrogenate the exposed surfaces of the (100) silicon substrate 10. In some embodiments, the heating under hydrogen can be replaced with heating under an inert gas.

Since most Group III elements will react directly with silicon, the prealuminization step is performed to stabilize the silicon nucleation sites prior to forming the dual phase Group III nitride structure; no Al layer is formed during this step of the present application. If the prealuminization step is not performed, the dual phase Group nitride structures subsequently formed will not be as selectively deposited around the patterned dielectric material structures 16. The prealuminization step is performed by introducing an organoaluminum precursor such as, for example, a trialkylaluminum compound, wherein the alkyl contains from 1 to 6 carbon atoms, into the reactor chamber. Examples of trialkylaluminum compounds that can be employed in the present application, include, but are not limited to, trimethylaluminum, triethylaluminum, and tributylaluminum. The organoaluminum precursor can be introduced in the reactor chamber of the MOCVD apparatus neat, or it can be admixed with an inert carrier gas. The prealuminization step is typically performed at a temperature of 450° C. or greater. In one embodiment, the introducing of the organoaluminum precursor typically occurs at a temperature from 500° C. to 600° C. In another embodiment, the introduction of the organoaluminum precursor occurs at a temperature from 600° C. to 900° C. Notwithstanding the temperature in which the organoaluminum precursor is introduced into the reactor chamber, the prealuminization is performed for a time period of 5 seconds to 120 seconds.

Figure 5:
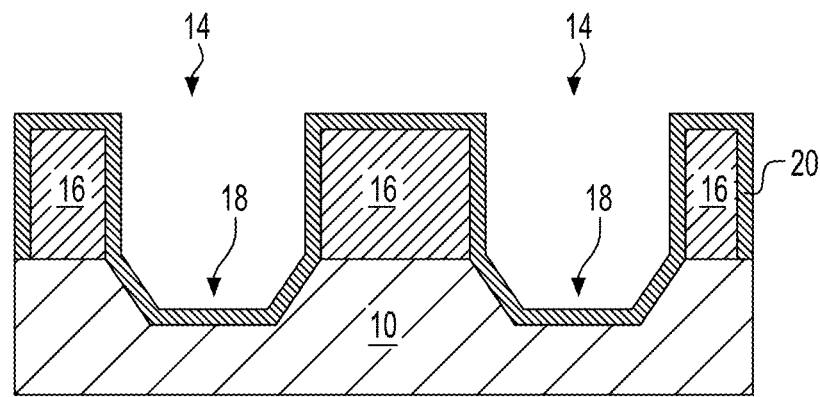
FIG. 5 is a cross sectional view of the structure of FIG. 4 after forming a buffer layer on exposed surfaces of the patterned dielectric material structures and the silicon substrate.

Referring now to FIG. 5, there is illustrate the structure of FIG. 4 after forming a conformal buffer layer 20 on exposed surfaces of the patterned dielectric material structures 16 and on exposed surfaces (A,B) of the (100) silicon substrate 10. In one embodiment, the buffer layer 20 includes AlN.

The buffer layer 20 may be formed by introducing an organo-Group III element containing precursor such as, for example, an organoaluminum precursor (i.e., a trialkylaluminum compound as mentioned above) and a nitride precursor such as, for example, ammonium nitride into the reactor chamber of the MOCVD apparatus. An inert carrier gas may be present with one of the precursors used in forming the buffer layer 20, or an inert carrier gas can be present with both the precursors used in forming the buffer layer 20. The buffer layer 20 is typically formed at a temperature of 600° C. or greater. In one embodiment, the deposition of the buffer layer 20 typically occurs at a temperature from 650° C. to 850° C. In another embodiment, the deposition of the buffer layer 20 typically occurs at a temperature from 850° C. to 1050° C. Notwithstanding the temperature in which the buffer layer 20 is formed, the deposition of the buffer layer 20 is performed for a time period of 1 minute to 20 minutes. The buffer layer 20 that is formed typically has a thickness from 10 nm to 250 nm, with a thickness from 60 nm to 80 nm being even more typical.

Figure 6:
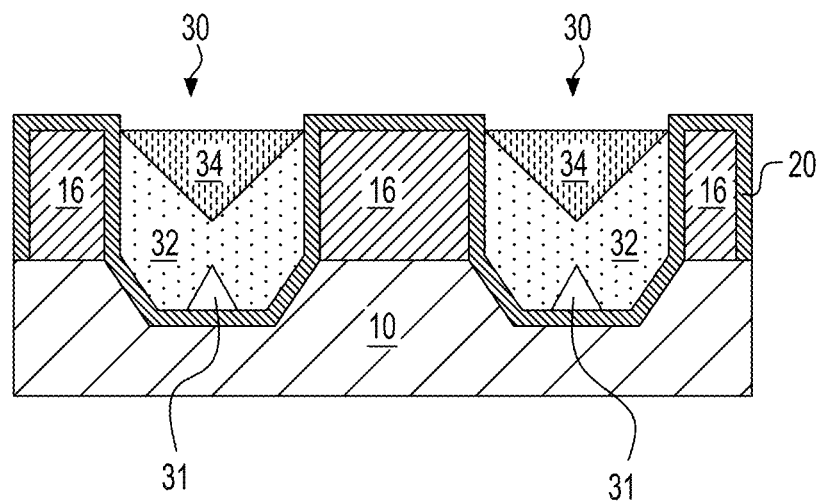
FIG. 6 is a cross sectional view of the structure of FIG. 5 after forming a dual phase Group III nitride structure filling a space between each neighboring pair of the patterned dielectric material structures and one of the second openings located beneath the space.

Referring now to FIG. 6, there is illustrated the structure of FIG. 5 after selectively forming a dual phase Group III nitride structure 30 within a space between each neighboring pair of the patterned dielectric material structures 16 (i.e. a first opening 14) and one of the second openings 18 located beneath the space. Each dual phase Group III nitride structure 30 essentially fills the entirety of each second opening 18; a void 31 can be present within each second opening 18. As shown in FIG. 6, a bottommost surface of each dual phase Group III nitride structure 30 extends above the planar surface (designated previously as B) of the (100) silicon substrate 10 that has a (100) crystal plane.

Each dual phase Group III nitride structure 30 comprises a wurtzite phase region 32 and a cubic phase region 34. The term "wurtzite phase' denotes that the c-direction of the dual phase Group III nitride structure 30 is aligned with (111) direction of the original (100) silicon substrate 10. The wurtzite phase region 32 within each dual phase Group III nitride structure 30 surrounds sidewalls of neighboring patterned dielectric material structures 16 and located adjacent the slanted surface (designated previously as A) of the (100) silicon substrate 10 having the (111) crystal plane. In some embodiments of the present application, the cubic phase region 34 of each dual phase Group III nitride structure 30 defines an entire uppermost surface of each dual phase Group III nitride structure 30. In some embodiments of the present application, the cubic phase region 34 of each dual phase Group III nitride structure 30 has a shape of an inverted triangle (see FIG. 6 and the SEM shown in FIG. 7 of the present application). As shown, the base of the inverted triangular constitutes an uppermost surface of each dual phase Group III nitride structure 30, while the apex of the inverted triangular is located beneath the uppermost surface of each dual phase Group III nitride structure 30.

The dual phase Group III nitride structure 30 can be formed by epitaxially growing a Group III nitride material. Epitaxially growing, epitaxial growth and/or deposition" mean the growth of a semiconductor material on a deposition surface of a semiconductor material, in which the semiconductor material being grown has the same crystalline characteristics as the semiconductor material of the deposition surface. During the epitaxial growth, the deposited Group III nitride material first nucleates from the buffer layer 20 that is present at the slanted surfaces of the (100) silicon substrate 10 having the (111) crystal plane within each second opening 18 in a wurtzite phase which is a lower energy phase and forms preferentially over the cubic phase. As the two fronts of the deposited Group III nitride material having the wurtzite phase meet to form the wurtzite phase region 32, a phase change to cubic occurs, resulting in the formation of the cubic phase region 34 over the wurtzite phase region 32. The deposition of the Group III nitride material providing the dual phase Group III nitride structures 30 is typically performed by at a temperature of 1000° C. or greater. In one embodiment, the Group III nitride material providing the dual phase Group III nitride structures 30 is deposited by MBE, MOCVD HVPE at a temperature ranging from 1100° C. to 1250° C. Notwithstanding the temperature in which the dual phase Group III nitride structures 30 are formed, the deposition of the Group III nitride material providing the dual phase Group III nitride structures 30 is performed for a time period of 1 minute to 2 hours.

Each dual phase Group III nitride structure 30 that is deposited can be doped or undoped. By "undoped" it is meant that the maximum dopant concentration of p-type or n-type dopants that are present in the epitaxial semiconductor material is less than $5 \times 10^{17}$ atoms/cm$^3$. If doped, the dopant can be introduced into the dual phase Group III nitride structures 30 in-situ during the epitaxy process or by ion implantation after the epitaxy process.

In some embodiments of the present application, and as illustrated in FIG. 6, a void 31 can be formed within each second opening 18. When present, the void 31 is formed within a bottommost portion of each second opening 18 and laterally surrounded by the wurtzite phase region 32 of each dual phase Group III nitride structure 30. In other embodiments (not shown), no void is formed.

In some embodiments, each dual phase Group III nitride structure 30 may have an uppermost surface that is coplanar with the uppermost surface of each patterned dielectric material structure 16. In other embodiments each dual phase Group III nitride structure 30 may have an uppermost surface that is vertically offset, either above or below, the uppermost surface of each patterned dielectric material structure 16. The dual phase Group III nitride structures 30 typically have a thickness from 100 nm to 5000 nm, with a thickness from 500 nm to 1000 nm being even more typical.

Exemplary Group III nitride materials that can be employed in the dual phase Group III nitride structure 30 include, but are not limited to, GaN, AlGaN, InGaN and AlInGaN. Notwithstanding the composition of each dual phase Group III nitride structure 30, each dual phase Group III nitride structure 30 is single crystal. In one embodiment, each dual phase Group III nitride structure 30 is composed of GaN.

Figure 7:
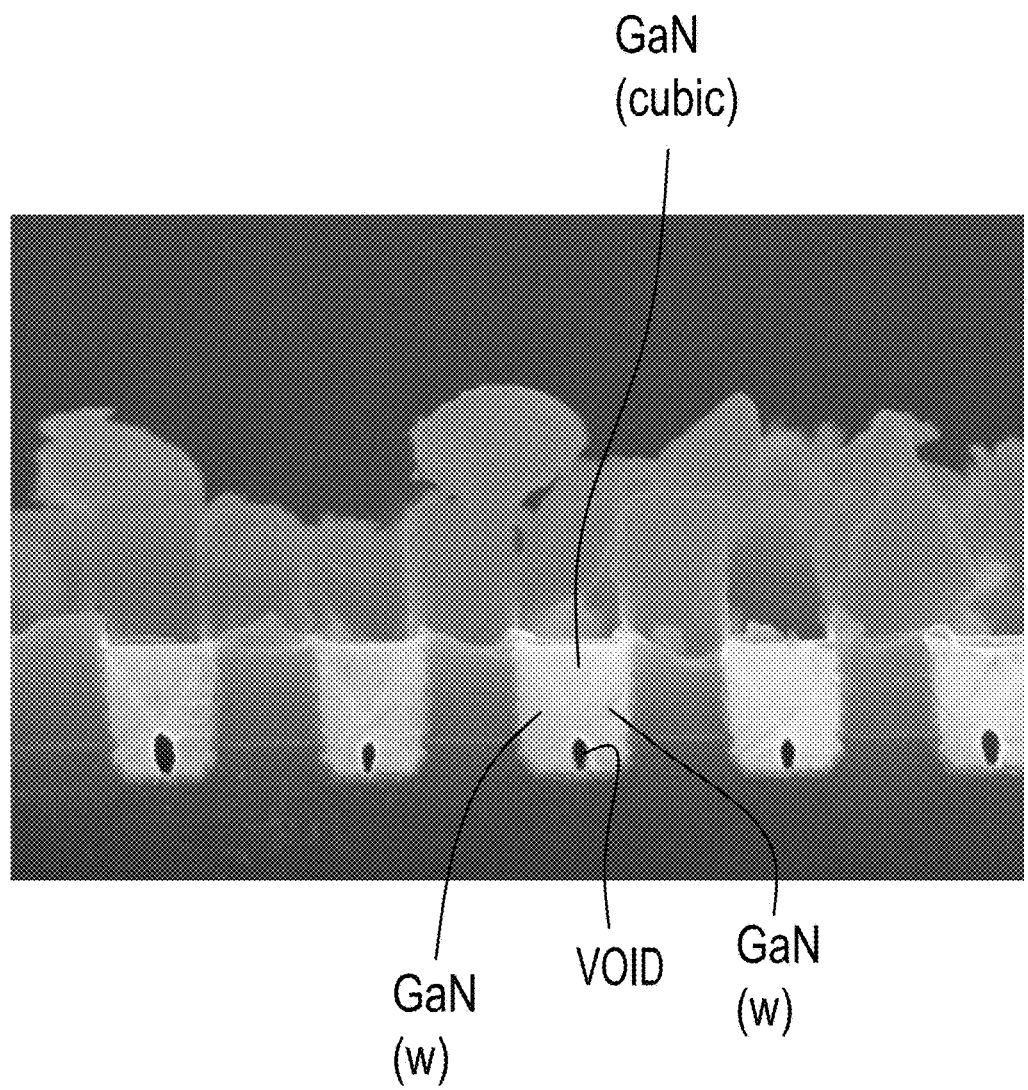
FIG. 7 is a scanning electron micrograph (SEM) of a structure including a dual phase gallium nitride structure integrated on a (100) silicon substrate that is formed using the method of the present application.

Referring now to FIG. 7, there is illustrated a scanning electron micrograph (SEM) of a structure including a dual phase GaN structure integrated on a (100) silicon substrate that is formed using the method of the present application. The SEM clearly depicts that the dual phase GaN structure containing a cubic GaN phase region and a wurtzite (w) GaN phase region was formed using the method of the present application. The initiation of wurtzite to cubic phase transition occurs where the opposite wurtzite growth fronts first meet—that meeting point later becomes the apex of the inverted triangle containing the cubic phase region.

Figure 8:
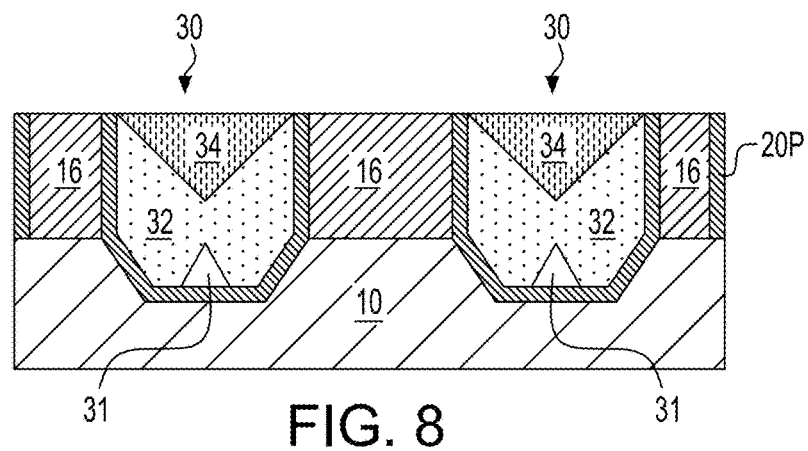
FIG. 8 is a cross sectional view of the structure of FIG. 6 after removing portions of the buffer layer from an uppermost surface of each patterned dielectric material structure.

Referring now to FIG. 8, there is illustrated the structure of FIG. 6 after performing planarization which removes the horizontal portion of the buffer layer 20 that is present on the uppermost surface of each of the patterned dielectric material structures 16 stopping on the uppermost surface of each dual phase Group III nitride structure 30 and the uppermost surface of each patterned dielectric material structure 16. A planar structure is provided in which the remaining portion of the buffer layer 20 (herein referred to as buffer layer portion 20P), dual phase Group III nitride structure 30, and each patterned dielectric material structure 16 have uppermost surfaces that are coplanar with each other. The planarization process that is used in the present application may include chemical mechanical polishing (CMP) and/or grinding.

Figure 9:
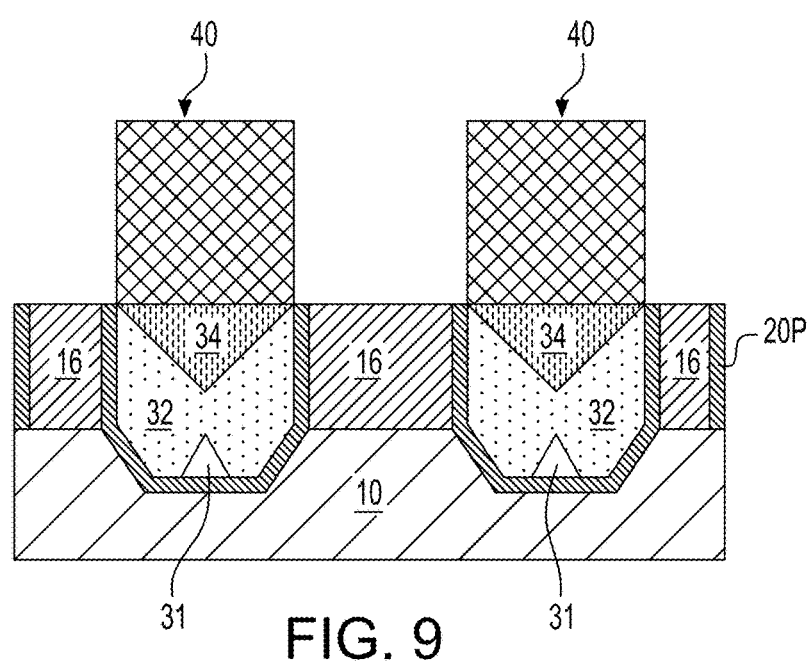
FIG. 9 is a cross sectional view of the structure of FIG. 8 after epitaxially growing at least one Group III nitride layer over an uppermost surface of each dual phase Group III nitride structure.

Referring now to FIG. 9, there is illustrated the structure of FIG. 8 after epitaxially growth of at least one Group III nitride layer 40 over each dual phase Group III nitride structure 30. In one embodiment, the at least one Group III nitride layer 40 is composed of GaN, AlGaN, InGaN or AlInGaN.

Since the epitaxial deposition process is employed, each of the at least one Group III nitride layer 40 is epitaxially aligned with the underlying uppermost surface of each dual phase Group III nitride structure 30. In the present embodiment, since the top surface of the cubic phase region 34 constitutes an entire uppermost surface of each dual phase Group III nitride structure 30, each of the at least one Group III nitride layer 40 has the same crystalline characteristics as that of the cubic phase region 34 in each dual phase Group III nitride structure 30. Thus, each of the at least one Group III nitride layer 40 also has a cubic phase. Each of the at least one Group III nitride layer 40 may also be referred to as a non-polar Group III nitride layer as the cubic phase is non-polar. In some embodiments, the epitaxial deposition process is a selective deposition process. The temperature for epitaxial deposition in formation of the Group III nitride layer 40 typically ranges from 750° C. to 950° C. Relatively low temperatures favor the formation of the cubic phase Group III nitride film over the wurtzite phase Group III nitride film.

Figure 10:
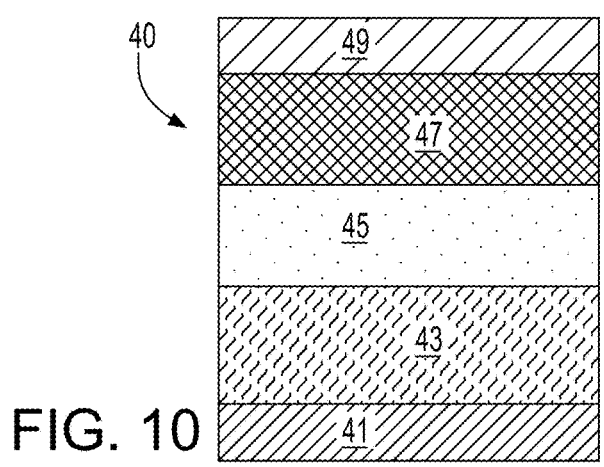
FIG. 10 illustrates components of the at least one Group III nitride layer that provides a laser diode.

The at least one Group III nitride layer 40 can be employed in a variety of photonic devices including light emitting diodes, laser diodes and photodetectors. In one embodiment and as shown in FIG. 10, the at least one Group III nitride layer 40 has a multilayer structure that provides a laser diode. In one embodiment, the at least one Group III nitride layer 40 includes, from bottom to top, a bottom contact layer 41, a bottom cladding layer 43, a light emitting layer 45, a top cladding layer 47 and a top contact layer 49. The light-emitting layer 45 is a layer within which light is emitted by recombination of carriers (i.e., electrons and holes). The bottom cladding layer 43 and the top cladding layer 47 are layers for increasing a carrier density in the light-emitting layer 45L.

The bottom contact layer 41 may include a first n-doped Group III nitride material and may have a thickness ranging from 100 nm to 500 nm, although lesser and greater thicknesses can also be employed. In one embodiment, the bottom contact layer 41 is made of silicon-doped $In_xGa_{1-x}N$ with x=0.05. The bottom contact layer 41 typically has a high dopant concentration level ranging from $1\times10^{18}$ atoms/cm$^3$ to $5\times10^{18}$ atoms/cm$^3$.

The bottom cladding layer 43 may include a second n-doped Group III nitride material and may have a thickness ranging from 10 nm to 1 μm, although lesser and greater thicknesses can also be employed. In one embodiment, the bottom cladding layer 43 has a bilayer structure including a lower layer of silicon-doped $Al_xGa_{1-x}N$ with x=0.05 and an upper layer of silicon-doped GaN. The lower layer has a dopant concentration of $5\times10^{17}$ atoms/cm$^3$ and a thickness of 200 nm, while the upper layer has a dopant concentration of $1\times10^{18}$ atoms/cm$^3$ and a thickness of 600 nm.

The light-emitting layer 45 may include a single or a multiple quantum well (MQW) structure composed of GaN/InGaN/GaN layers with a total thickness between 2 nm and 100 nm.

The top cladding layer 47 may include a first p-doped Group III nitride material and may have a thickness ranging from 10 nm to 1 μm, although lesser and greater thicknesses can also be employed. In one embodiment, the top cladding layer 47 has a bilayer structure including a lower layer of carbon-doped $Al_xGa_{1-x}N$ with x=0.2 and an upper layer of carbon-doped $Al_xGa_{1-x}N$ with x=0.05. The lower layer may have a dopant concentration of $5\times10^{17}$ atoms/cm$^3$ and a thickness of 600 nm, while the upper layer may have a dopant concentration of $3\times10^{18}$ atoms/cm$^3$ and a thickness of 200 nm.

The top contact layer 49 may include a second p-doped Group III nitride material and may have a thickness ranging from 100 nm to 1 μm, although lesser and greater thicknesses can also be employed. In one embodiment, the top contact layer 49L is made of carbon-doped GaAs having a dopant concentration of $3\times10^{18}$ atoms/cm$^3$ and a thickness of 200 nm.

In the present application, growth of epitaxial Group III nitride layers on the non-polar cubic phase region of a dual phase Group III nitride structure results in formation of non-polar Group III nitride layers over a (100) silicon substrate. Employing such non-polar Group III nitride layers in photonic devices significantly improves device performance due to reduced polarization-induced electric filed and reduced lattice mismatch.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method for forming a semiconductor structure comprising:
   forming a dielectric material layer on an uppermost surface of a (100) silicon substrate;
   patterning the dielectric material layer forming a plurality of patterned dielectric material structures on portions of the uppermost surface of the (100) silicon substrate and exposing other portions of the uppermost surface of the (100) silicon substrate;
   etching the exposed another portions of the uppermost surface of the (100) silicon substrate to form a plurality of openings within the (100) silicon substrate, each of the plurality of openings exposing a surface having a (111) crystal plane within the (100) silicon substrate;

forming a buffer layer on exposed surfaces of the plurality of patterned dielectric material structures and the (100) silicon substrate;

forming a dual phase Group III nitride structure filling a space between each neighboring pair of the plurality of patterned dielectric material structures and one of the plurality of openings located beneath the space, wherein the dual phase Group III nitride structure comprises a wurtzite phase region and a cubic phase region, wherein the cubic phase region defines an uppermost surface of the Group III nitride structure; and epitaxially growing at least one Group-III nitride layer on the cubic phase region of the dual phase Group-III nitride structure, wherein the epitaxially growing the at least one Group-III nitride layer comprises:

epitaxially growing a bottom contact layer over the cubic phase region of the dual phase Group III nitride structure, wherein the bottom contact layer comprises silicon-doped $In_xGa_{1-x}N$ with x equal to 0.05;

epitaxially growing a bottom cladding layer over the bottom contact layer, wherein the bottom cladding layer comprises a lower layer of a silicon-doped $Al_xGa_{1-x}N$ with x equal to 0.05 and an upper layer of silicon-doped GaN;

epitaxially growing a light emitting layer over the bottom cladding layer;

epitaxially growing a top cladding layer over the light emitting layer, wherein the top cladding layer comprises a lower layer of carbon doped $Al_xGa_{1-x}N$ with x equal to 0.2 and an upper layer of carbon-doped $Al_xGa_{1-x}N$ with x equal to 0.05; and epitaxially growing a top contact layer over the top cladding layer, wherein the top contact layer comprises carbon-doped GaAs.

2. The method of claim 1, wherein the cubic phase region of the dual phase Group III nitride structure has a shape of an inverted triangular and wherein a base of the inverted triangular constitutes the entirety of the uppermost surface of the dual phase Group III nitride structure.

3. The method of claim 1, further comprising removing a horizontal portion of the buffer layer from an uppermost surface of each of the plurality of patterned dielectric material structures prior to the epitaxially growing the at least one Group III nitride layer.

4. The method of claim 1, wherein the buffer layer comprises AlN.

5. The method of claim 1, wherein the dual phase Group III nitride layer comprises GaN.

6. The method of claim 1, wherein the exposed another portions of the uppermost surface of the (100) silicon substrate is etched by a crystallographic wet etch.

7. The method of claim 1, wherein each of the at least one Group III nitride layer has a cubic phase.

8. The method of claim 1, wherein the dual phase Group III nitride structure is formed at a temperature ranging from 1100° C. to 1250° C.

9. The method of claim 1, wherein the at least one Group III nitride layer is formed at a temperature ranging from 750° C. to 950° C.

10. A semiconductor structure comprising:
a (100) silicon substrate having a plurality of openings located within the (100) silicon substrate, wherein each of the plurality of openings exposes a surface of the (100) silicon substrate having a (111) crystal plane;

a plurality of patterned dielectric material structures located on an uppermost surface of the (100) silicon substrate;

a dual phase Group III nitride structure filling a space between each neighboring pair of the plurality of patterned dielectric material structures and one of the plurality of openings located beneath the space, wherein the dual phase Group III nitride structure comprises a wurtzite phase region and a cubic phase region, wherein the cubic phase defines at least a portion of an uppermost surface of the dual phase Group III nitride structure; and at least one Group III nitride layer located over the dual phase Group III nitride structure, wherein the at least one Group III nitride layer comprises:

a bottom contact layer located over the cubic phase region of the dual phase Group III nitride structure and comprising silicon-doped $In_xGa_{1-x}N$ with x equal to 0.05;

a bottom cladding layer located over the bottom contact layer and comprising a lower layer of a silicon-doped $Al_xGa_{1-x}N$ with x equal to 0.05 and an upper layer of silicon-doped GaN;

a light emitting layer located over the bottom cladding layer;

a top cladding layer located over the light emitting layer and comprising a lower layer of carbon doped $Al_xGa_{1-x}N$ with x equal to 0.2 and an upper layer of carbon-doped $Al_xGa_{1-x}N$ with x equal to 0.05; and a top contact layer located over the top cladding layer and comprising carbon-doped GaAs.

11. The semiconductor structure of claim 10, wherein the dual phase Group III nitride structure comprises GaN, AlGaN, InGaN, or AlInGaN.

12. The semiconductor structure of claim 10, wherein a portion of the dual phase Group III nitride structure within each of the plurality of openings extends above a surface of the (100) silicon substrate having a non-(111) crystal plane.

13. The semiconductor structure of claim 10, further comprising a buffer layer portion located between the dual phase Group III nitride structure and the neighboring sidewalls of the plurality of patterned dielectric material structures and surfaces of the (100) silicon substrate within each of the plurality of openings.

14. The semiconductor structure of claim 10, wherein the cubic phase region of the dual phase Group III nitride structure has a shape of an inverted triangular and wherein a base of the inverted triangular constitutes the entirety of an uppermost surface of the dual phase Group III nitride structure.

15. The semiconductor structure of claim 10, further comprising a cavity within each of the plurality of openings and located beneath the wurtzite phase region of the dual phase Group III nitride structure.

16. The semiconductor structure of claim 10, wherein an uppermost surface of the dual phase Group III nitride structure is coplanar with uppermost surfaces of one of the plurality of patterned dielectric material structure.

17. The semiconductor structure of claim 10, wherein each of the at least one Group III nitride layer has a cubic phase.

* * * * *